United States Patent
Lee et al.

(10) Patent No.: US 6,600,342 B1
(45) Date of Patent: Jul. 29, 2003

(54) COLUMN DECODER OF SEMICONDUCTOR MEMORY DEVICE

(75) Inventors: Jung-hwa Lee, Suwon (KR); Doo-yeol Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 43 days.

(21) Appl. No.: 09/693,520

(22) Filed: Oct. 20, 2000

(30) Foreign Application Priority Data

Oct. 20, 1999 (KR) ........................... 1999-45560

(51) Int. Cl.[7] ........................................... H03K 19/084
(52) U.S. Cl. ................... 326/105; 326/106; 326/108; 326/112
(58) Field of Search ................. 326/105–108, 326/112, 119, 121

(56) References Cited

U.S. PATENT DOCUMENTS 5,777,943 A * 7/1998 Kim et al. ............ 365/230.06
5,903,174 A * 5/1999 Landry et al. ............ 327/162
5,977,799 A * 11/1999 Kai et al. .................... 326/108
6,101,147 A * 8/2000 Takahashi et al. ...... 365/230.06

OTHER PUBLICATIONS

Rhyne, Fundamentals of Digital Systems Design, 1973, pp. 70–71.*

* cited by examiner

Primary Examiner—Michael Tokar
Assistant Examiner—Anh Tran
(74) Attorney, Agent, or Firm—Harness, Dickey & Pierce, P.L.C.

(57) ABSTRACT

A column decoder of a semiconductor memory device is provided. A column select line driver of the column decoder includes a NAND gate that performs a NAND operation on an output signal of a pre-decoder and a column select line enable signal and provides an output signal to a driver that selects a column select line. The column select line driver including the NAND gate is smaller than a conventional column select line driver including a NOR gate, thereby reducing the chip size of the memory device and decreasing a logic delay and a load.

8 Claims, 9 Drawing Sheets

COLUMN DECODER OF SEMICONDUCTOR MEMORY DEVICE

BACKGROUND OF THE INVENTION

1. Field of the Invention

The present invention relates to a column decoder of a semiconductor memory device and more particularly, to a column decoder of a synchronous dynamic random access memory (SDRAM) that activates a corresponding column select line (CSL) in response to a column address signal.

2. Description of the Related Art

Semiconductor memory devices, such as SDRAMs, have a column decoder, which receives a read or write command and activates a CSL designated by a column address signal in synchronization with a clock signal. As the densities of SDRAMs increase, the capacities of memory cell arrays of the SDRAMs increase, and the sizes and separations of circuit elements decrease. Hence, the resistance and the capacitance of a CSL considerably increase, and thus the size of a driver in a column decoder must be increased to drive the CSL, resulting in an increase in the chip size of the SDRAM or a reduction in the speed of the SDRAM.

Increasing a driver size in a column decoder has been an effective method for driving the CSL in low density SDRAM devices. However, increasing the processing speed in DRAMs of 256 Mbit or more than 1 Gbit is difficult even though the size of a driver is increased.

SUMMARY OF THE INVENTION

An aspect of the present invention provides a column decoder that can improve the processing speed of a semiconductor memory device while avoiding the chip size increase of the device. An embodiment of the column decoder includes a column select line driver having a NAND gate. The NAND gate performs a NAND operation with a column select line enable signal and an output signal of a sub-predecoder generated in response to a column address signal, and provides the output signal to the selected column select line.

The column select line driver including the NAND gate is smaller than a conventional column select line driver including a NOR gate, thereby reducing the chip size of the memory device and decreasing a logic delay and a load.

BRIEF DESCRIPTION OF THE DRAWINGS

The features and advantages of the present invention will become more apparent by describing in detail a specific embodiment thereof with reference to the attached drawings in which.

Use of the same reference symbols in different figures indicates identical or similar items.

DETAILED DESCRIPTION OF THE INVENTION

Figure 1:
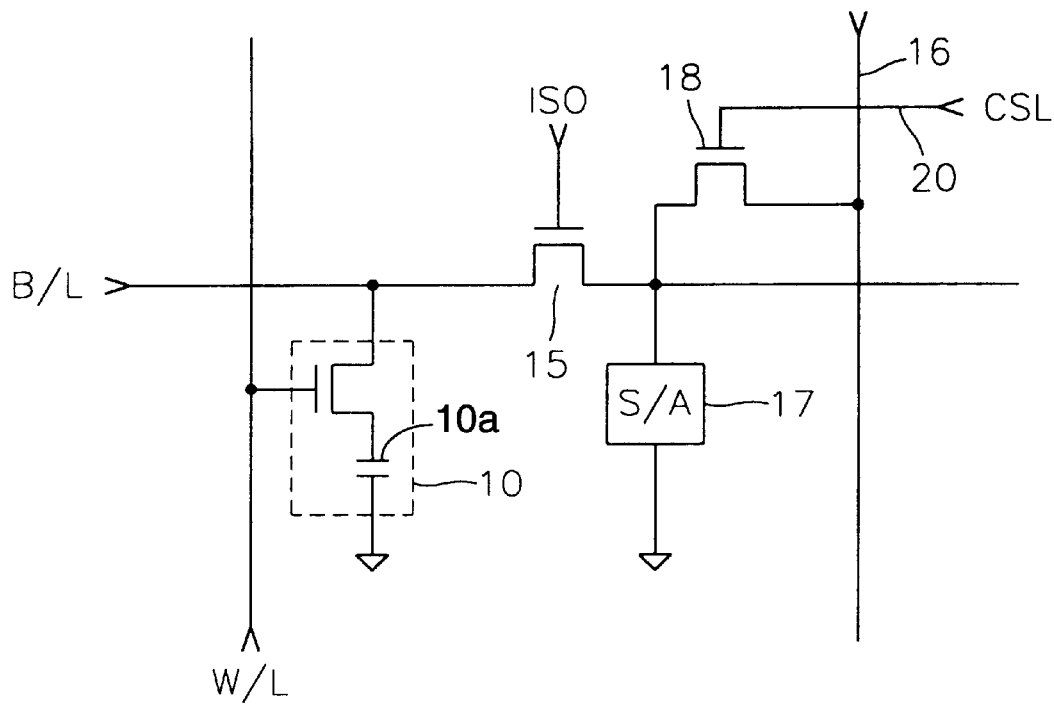
FIG. 1 is a circuit diagram of a semiconductor memory cell.

FIG. 1 illustrates a memory cell 10 and peripheral components of a SDRAM. Referring to FIG. 1, a read operation of a semiconductor memory device can be explained. Before the read operation, a charge corresponding to 0 or 1 is stored in a capacitor 10a in the memory cell 10. When a word line W/L is driven and an isolation transistor 15 is turned on in response to an isolation signal ISO, the charge stored in the memory cell 10 is shared on a bit line B/L. Alternatively, the charge stored in complementary plates of the capacitor 10a of the memory cell 10 can be shared respectively with the bit line B/L and a complementary bit line (not shown). Before the charge is shared on the bit lines, an equalizer equalizes the bit lines.

A sense amplifier (S/A) 17 senses the charge on the bit line B/L and transmits an output signal to an input/output (I/O) line 16 when a column selecting transistor 18 is turned on.

The gate of the column selecting transistor 18 between the S/A 17 and the I/O line 16 connects to a column select line (CSL) 20. When the CSL 20 is enabled, as described above, the column selecting transistor 18 is turned on, so that the S/A 17 transmits an output signal to the I/O line 16. Each bit line B/L has a corresponding CSL, which is driven or not according to a column address signal applied from the outside of the SDRAM.

Figure 2:
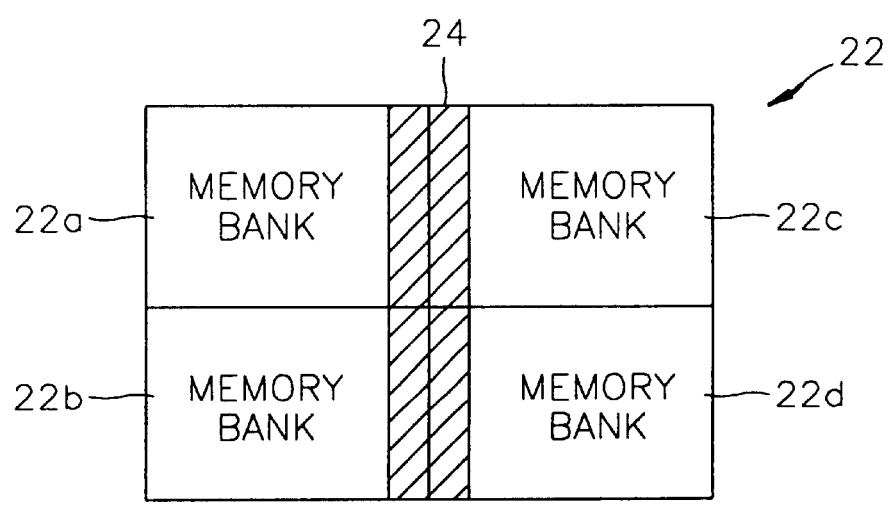
FIG. 2 is a block diagram of a memory cell array and a column decoder.

A column decoder is a circuit for driving the CSL 20 in response to the column address signal. FIG. 2 illustrates an arrangement of a memory cell array 22 and a column decoder 24. The memory cell array 22 includes four memory banks 22a, 22b, 22c, and 22d. The column decoder 24, which drives a CSL corresponding to a column address signal in response to a clock signal, is between the memory banks 22a and 22c and between the memory banks 22b and 22d.

Figure 3:
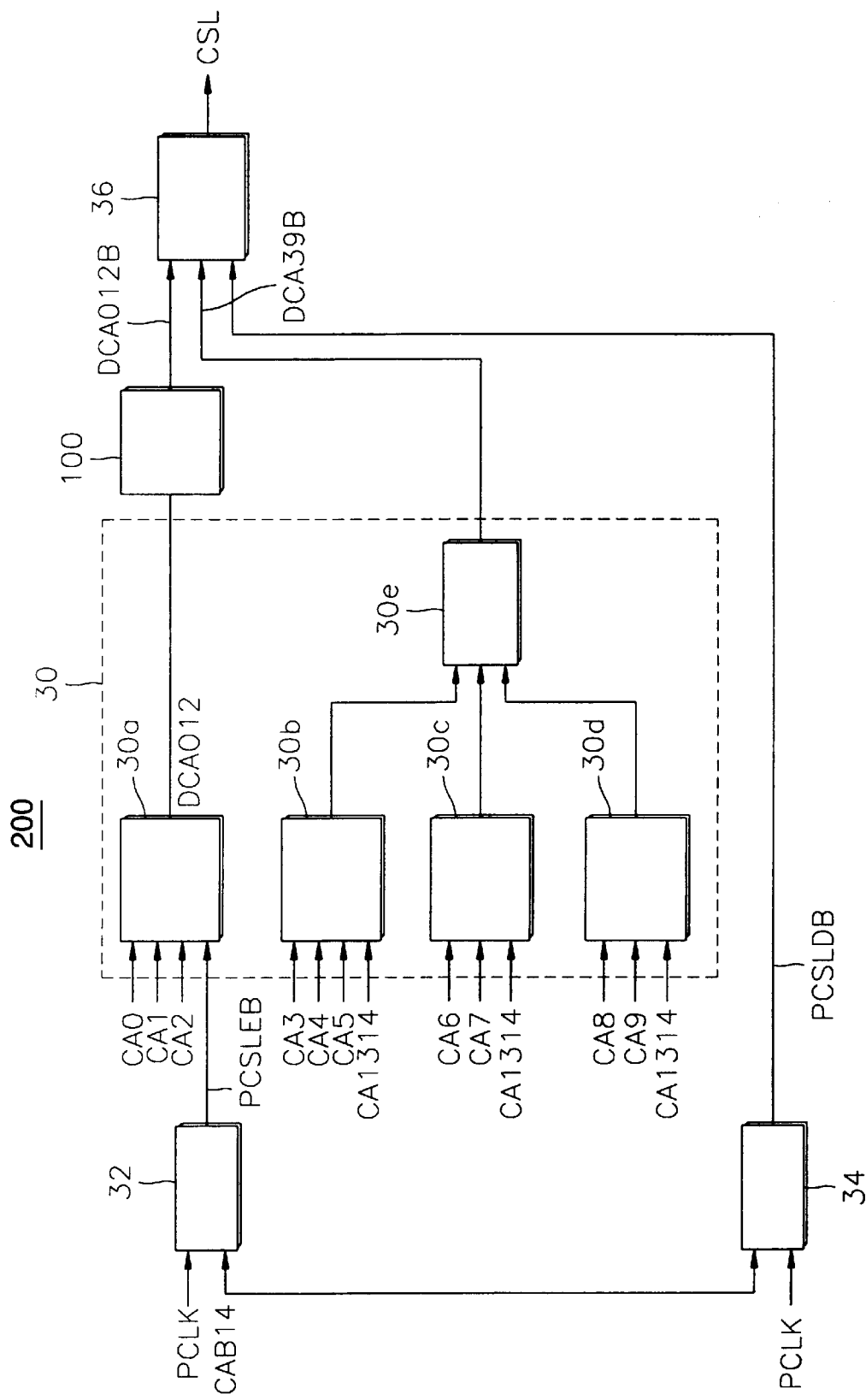
FIG. 3 is a block diagram of a conventional column decoder.

FIG. 3 is a block diagram of a portion of a conventional column decoder 200 that drives a column select line. The column decoder 200 includes a pre-decoder 30 that selects a CSL according to a column address signal CAi (i=0 to 9), a column select enable signal generator 32, a column select disable signal generator 34, a buffer 100, and a column select line driver 36.

When each memory bank has a memory capacity of 1 Kbit, a column address for selecting a memory cell in a memory bank typically includes 10 bits CA0 to CA9. In the predecoder 30, the 10-bit column address signal is divided into two 3-bit groups (CA0, CA1, and CA2) and (CA3, CA4, and CA5) and two 2-bit groups (CA6 and CA7) and (CA8 and CA9). The column address signal bit groups (CA0, CA1, and CA2), (CA3, CA4, and CA5), (CA6 and CA7), and (CA8 and CA9) are respectively decoded by a first to fourth subpredecoders 30a to 30d. The first sub-predecoder 30a performs NAND operations on the three bits CA0, CA1, and CA2 (or one or more of their complements depending on the CSL) and an enable signal PCSLEB generated by the column select enable signal generator 32. After the NAND operation, the sub-predecoder 30a outputs and transmits a signal DCA012 to the buffer 100. Then, the buffer 100 inverts the signal DCA012 and outputs an inverted signal DCA012B to the column select line driver 36. The bit groups decoded through sub-predecoders 30b to 30d are provided to a fifth sub-predecoder 30e, which performs NAND operations on the resulting signals from sub-predecoders 30b to 30d. The operation of the sub-predecoder 30e produces and transmits a signal DCA39B to the column select line driver 36.

In FIG. 3, a signal PCLK denotes an internal clock signal. A signal CA1314 results from an AND operation performed on the bank select signals CA13 and CA14 (or their complements depending banks). The column select line driver 36 responds to the signals DCA012B and DCA39B and the column select line disable signal PCSLDB and enables or disables the column select line CSL depending on whether the column address signal CAi corresponds to the column select line CSL.

Figure 4:
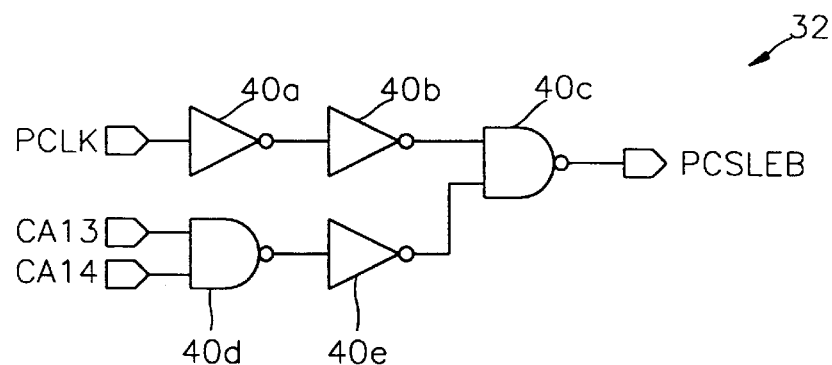
FIG. 4 is a logic diagram of the column select enable signal generator of the column decoder of FIG. 3.

FIG. 4 is a logic diagram of the column select enable signal generator 32 of FIG. 3. The column select enable signal generator 32 includes two NAND gates 40c and 40d and three inverters 40a, 40b, and 40e. The internal clock signal PCLK is provided to the NAND gate 40c through inverters 40a and 40b. Bank select signals CA13 and CA14 are provided to the NAND gate 40c through the NAND gate 40d and the inverter 40e. Then, the NAND gate 40c outputs the column select line enable signal PCSLEB.

Figure 5:
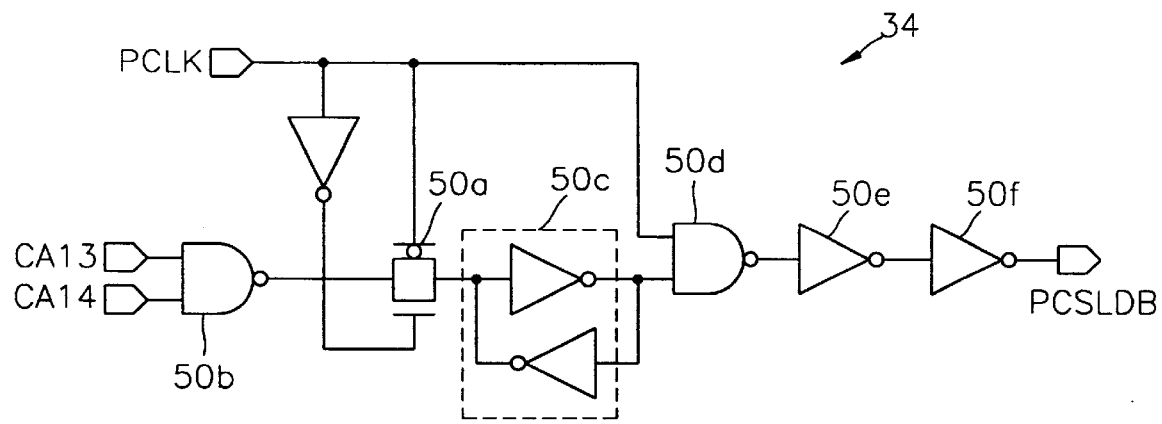
FIG. 5 is a logic diagram of the column select disable signal generator of the column decoder of FIG. 3.

FIG. 5 is a logic diagram of the column select disable signal generator 34 of FIG. 3. The internal clock signal PCLK is applied to a transmission gate 50a as a control signal. The bank select signals CA13 and CA14 are also input to the transmission gate 50a through a NAND gate 50b. Accordingly, the transmission gate 50a gates the bank select signals CA13 and CA14 when the internal clock signal PCLK is applied thereto.

The output signal of the transmission gate 50a is applied to one input of a NAND gate 50d through an inverting latch 50c. The internal clock signal PCLK is applied to the other input of the NAND gate 50d. Accordingly, the NAND gate 50d outputs the output signal of the transmission gate 50a in synchronization with the internal clock signal PCLK. The output signal of the NAND gate 50d is output as the column select line disable signal PCSLDB through inverters 50e and 50f.

Figure 6:
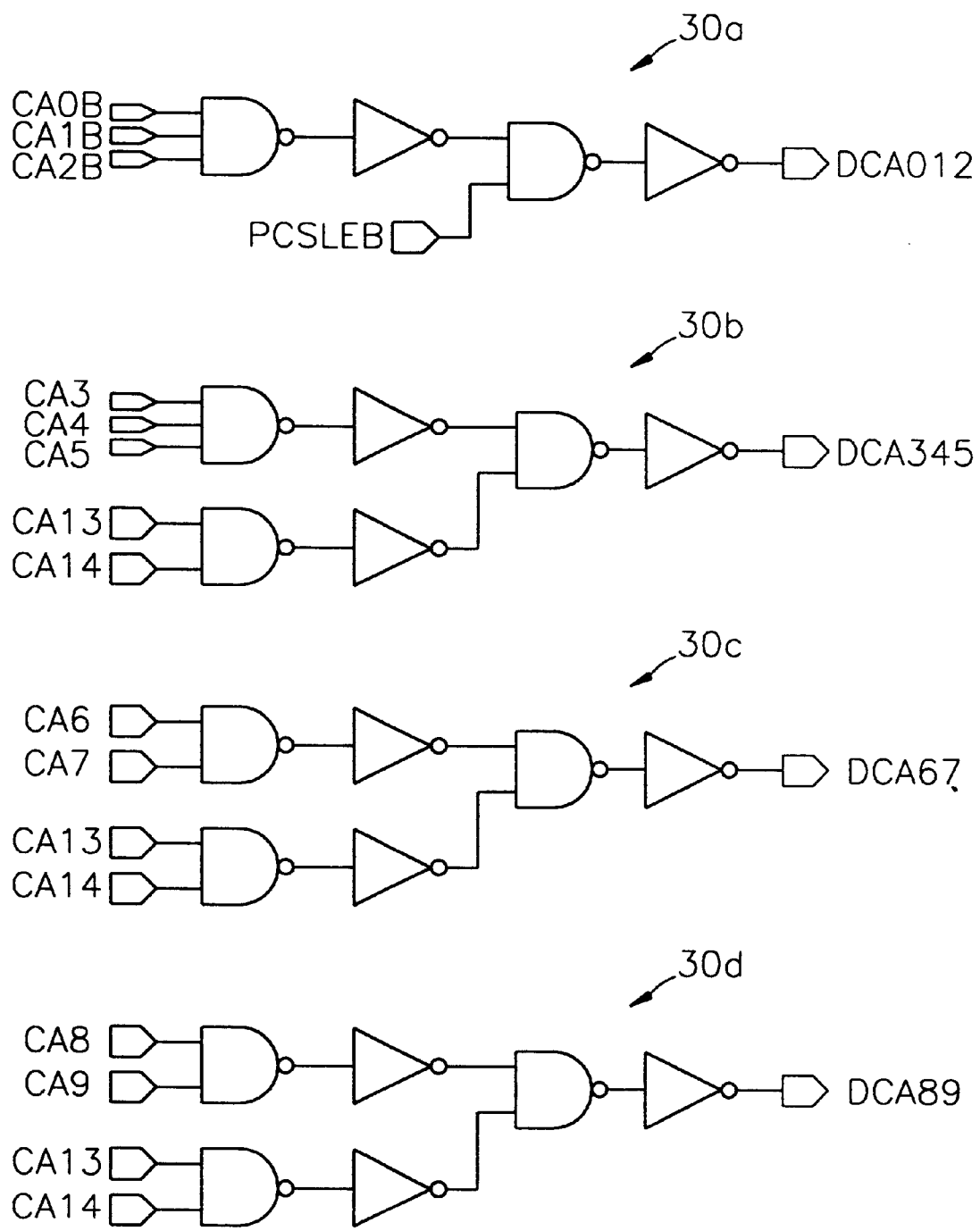
FIG. 6 is a logic diagram of the first to fourth sub-predecoders of the column decoder of FIG. 3.

FIG. 6 is a logic diagram of the sub-predecoders 30a to 30d of FIG. 3. The sub-predecoder 30a receives the bits CA0 to CA2 of the column address signal and the column select line enable signal PCLSEB generated from the column select enable signal generator 32, performs an AND operation, and generates and outputs the signal DCA012 to the buffer 100 (FIG. 3). The buffer 100 inverts the signal DCA012 and outputs the inverted signal DCA012B to the column select line driver 36.

The sub-predecoder 30b receives the bits CA3 to CA5 of the column address signal and the bank select signals CA13 and CA14, performs an AND operation, and generates and outputs a signal DCA345 to the sub-predecoder 30e. The sub-predecoder 30c receives the two bits CA6 and CA7 of the column address signal and the bank select signals CA13 and CA14, performs an AND operation, and output a signal DCA67 to the sub-predecoder 30e. The sub-predecoder 30d receives the two bits CA8 and CA9 of the column address signal and the bank select signals CA13 and CA14, performs an AND operation, and generates and outputs a signal DCA89 to the sub-predecoder 30e. As noted above in regard to FIG. 3, the NAND or AND operation combining the bank select signals CA13 and CA14 can be performed outside the sub-predecoders 30b, 30c, and 30d rather than repeating the operation in each of the sub-predecoders 30b, 30c, and 30d.

Figure 7:
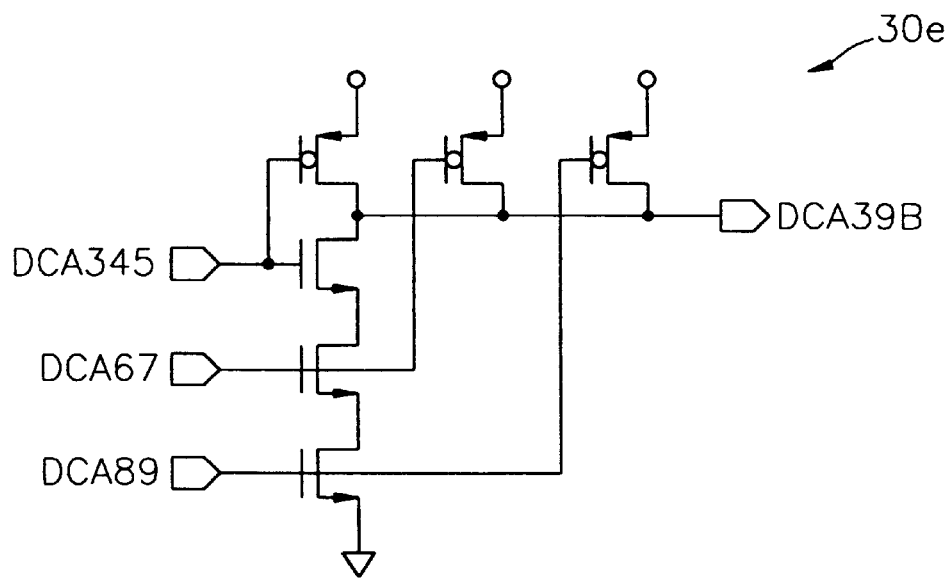
FIG. 7 is a logic diagram of the fifth sub-predecoder of the column decoder of FIG. 3.

FIG. 7 is a logic diagram of the sub-predecoder 30e of FIG. 3. The sub-predecoder 30e receives the signals DCA345, DCA67, and DCA89 from the sub-predecoders 30b, 30c, and 30d, respectively, performs a NAND operation, and outputs the signal DCA39B to the column select line driver 36 of FIG. 3.

Figure 8:
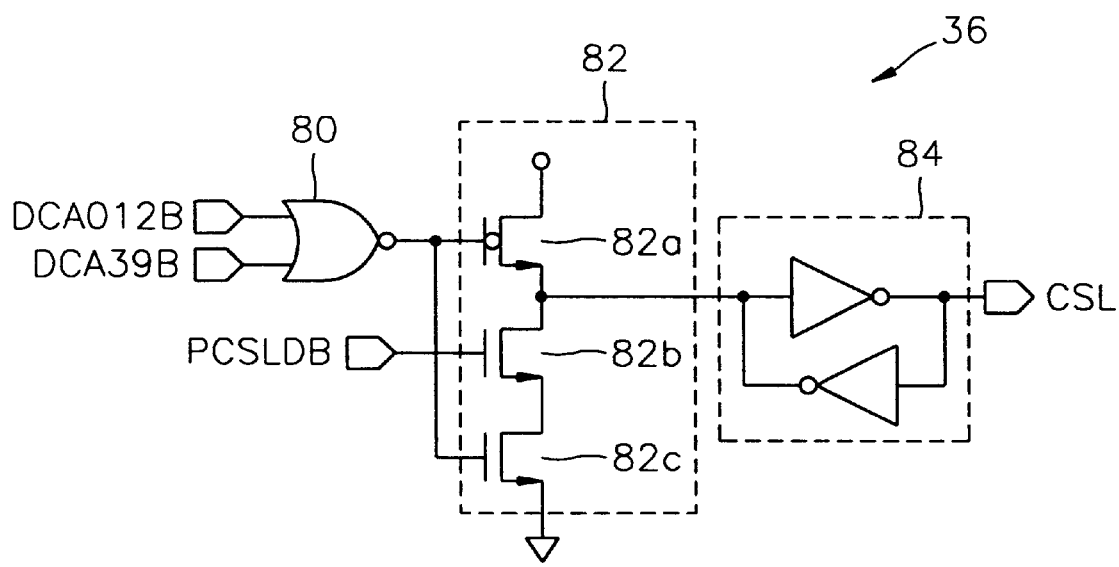
FIG. 8 is a logic diagram of a conventional column select line driver.

FIG. 8 is a logic diagram of the column select line driver 36 of FIG. 3. The column select line driver 36 includes a NOR gate 80, a driver 82, and a latch 84. The NOR gate 80 receives the signal DCA012B and the signal DCA39B, which include the signals decoded from the column address signal CAi and the column select line enable signal PCSLEB. The output signal of the NOR gate 80 drives the driver 82, so that the column select line CSL corresponding to the column address signal CAi is driven. The driver 82 includes a PMOS transistor 82a and two NMOS transistors 82b and 82c. The column select line disable signal PCSLDB turns on and off the NMOS transistor 82b.

Figure 9:
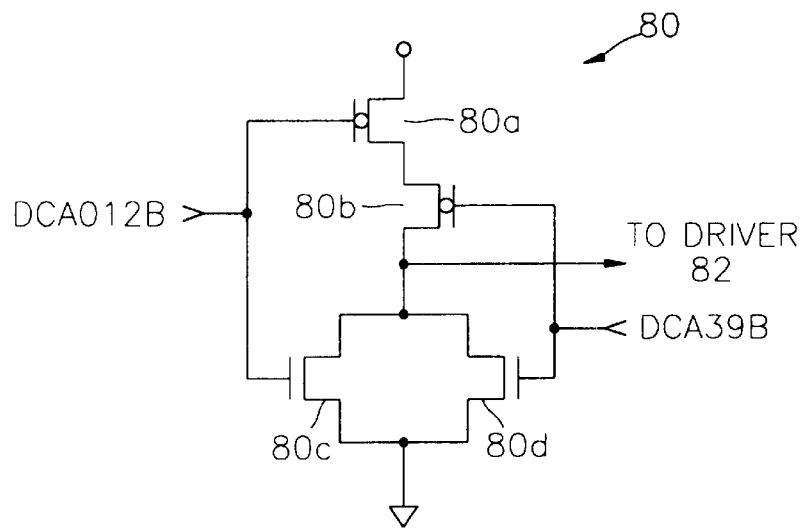
FIG. 9 is a logic diagram of a NOR gate of the column select line driver of FIG. 8.

FIG. 9 is a logic diagram of the NOR gate 80 of FIG. 8. The NOR gate 80 includes two PMOS transistors 80a and 80b serially connected to each other and two NMOS transistors 80c and 80d connected in parallel to each other. The signal DCA012B drives the PMOS transistor 80a and the NMOS transistor 80c, and the signal DCA39B drives the PMOS transistor 80b and the NMOS transistor 80d. An output signal from the NOR gate 80 is forwarded from a node between the PMOS transistor 80b and the NMOS transistor 80d.

The column decoder 200 of FIG. 3 has some drawbacks First, the size of the NOR gate 80 is large. In order to generate the output of the NOR gate 80, both of the PMOS transistors 80a and 80b must be turned on. Since each of the PMOS transistors 80a and 80b must have enough driving power to generate the output of the NOR gate 80, the NOR gate 80 must be relatively large. Further, the size of the NOR gate 80 increases in proportion to the number of input terminals thereof. For example, the NOR gate 80 with two input terminals is half the size of a similar NOR gate having four input terminals. This is caused by the difference of the current mobility between a PMOS transistor and an NMOS transistor. In other words, since the holes in a PMOS transistor move half as fast as electrons in an NMOS transistor, the PMOS transistor needs to have about twice the width of the NMOS transistor to compensate for the difference in the current mobilities of the PMOS and NMOS transistors. Accordingly, instead of inputting the column address signal CAi to the NOR gate 80 of the column select line driver 36, the column decoder 200 of FIG. 3 employs the predecoder 30 to decode the column address signal CAi to the NOR gate 80 and decrease the number of input terminals of the NOR gate 80. However, since the number of the predecoders increases as the capacity of a memory device increases, the reduction of the number of input terminals of the NOR gate 80 cannot effectively restrain the chip size increase.

Second, the driver 82 driven by the NOR gate 80 is large. The size of the driver 82 of FIG. 8 is proportional to the size of the NOR gate 80. Further, the size of the driver 82 increases as the number of the predecoders increases.

Figure 10:
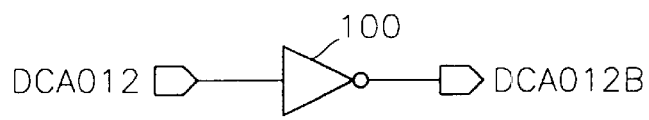
FIG. 10 is a logic diagram of a buffer for inverting an output signal of the first sub-predecoder of FIG. 3.

Third, the buffer 100 of FIG. 3 is needed because the NOR gate 80 of FIG. 8 receives negative-active signals. As shown in FIG. 10, the buffer 100 inverts the output DCA012 of the sub-predecoder 30a. Since the signal DCA012 from the sub-predecoder 30a is a result of decoding the three bits CA0 to CA2, the signal DCA012 is one of eight different decoded signals. Accordingly, eight buffers are needed for driving corresponding column select line drivers. In addition, as the number of memory cells increases, the number of the buffers increases, and the size of the memory device increases.

Fourth, the logic delay and load due to the column select line driver 36 of FIG. 8 are large. As described above, the sizes of the NOR gate 80 and the driver 82 are large. Accordingly, the logic delay is large, thereby limiting the operating frequency of a memory device such as a SDRAM. In addition, since the reduction of design rule dimensions in high capacity memory devices increases the resistance and capacitance of column select line CSL, the driving power of the column select line driver 36 must be increased. The increase of the driving power inevitably increases the size of the column select line driver 36.

Fifth, the driving power of the sub-predecoder 30e must be large since the sub-predecoder 30e is directly connected to the NOR gate 80. Because the sizes of the PMOS transistors 80a and 80b of the NOR gate 80 are large as described above, the driving power of the sub-predecoder 30e must be large. Thus, the size of the sub-predecoder 30e increases.

Figure 11:
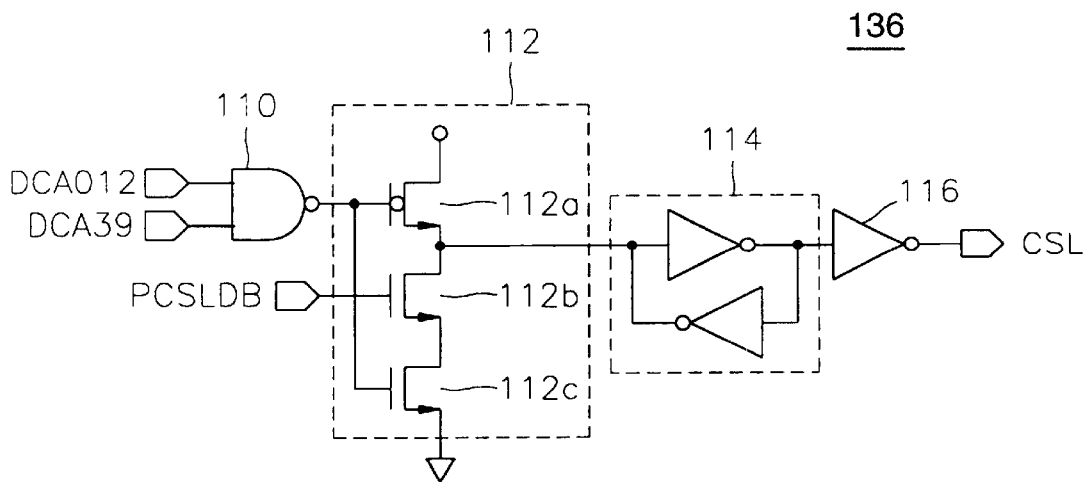
FIG. 11 is a logic diagram of a column select line driver in a column decoder according to an embodiment of the present invention.

FIG. 11 is a logic diagram of a column select line driver 136 of a column decoder according to an embodiment of the present invention. The column select line driver 136 includes a NAND gate 110, a driver 112, a latch 114, and an inverter 116.

The NAND gate 110, which drives the driver 112, receives a signal DCA012, which is obtained by performing an AND operation on the three bits CA0 to CA2 of a column address signal CAi and a column select line enable signal PCSLEB, and a signal DCA39, which is obtained by performing an AND operation on the seven bits CA3 to CA9 of the column address signal.

When both signals DCA012 and DCA39 are at a "high" level, the output of the NAND gate 110 is at a "low" level, so that a PMOS transistor 112a of the driver 112 is turned on and an NMOS transistor 112c is turned off. Accordingly, the electric potential at a node between the PMOS transistor 112a and an NMOS transistor 112b is at a "high" level.

When the signal DCA012 is at a "low" level (the signal DCA39 maintains the "high" level), the output of the NAND gate 110 is at a "high" level, so that the PMOS transistor 112a is turned off and the NMOS transistor 112c is turned on. Accordingly, the electric potential at the node between the PMOS transistor 112a and the NMOS transistor 112b is level determined by the latch 114 when the column select line disable signal PCSLDB is at a "low" level. Then, when the column select line disable signal PCSLDB is at a "high" level, the NMOS transistor 112b is turned on, and the electric potential at the node between the PMOS transistor 112a and the NMOS transistor 112b becomes at a "low" level.

Since the signal DCA012 includes a signal decoded from the column select line enable signal PCSLEB, the NAND gate 110 receives the signals decoded from the column address signal CAi and the column select line enable signal PCSLEB, outputting a signal to the driver 112. Then, the driver 112 drives, through the latch 114, a column select line CSL corresponding to the column address signal CAi.

The column select line driver 136 of FIG. 11 has the following advantages over the column select line driver 36 of FIG. 8.

Figure 12:
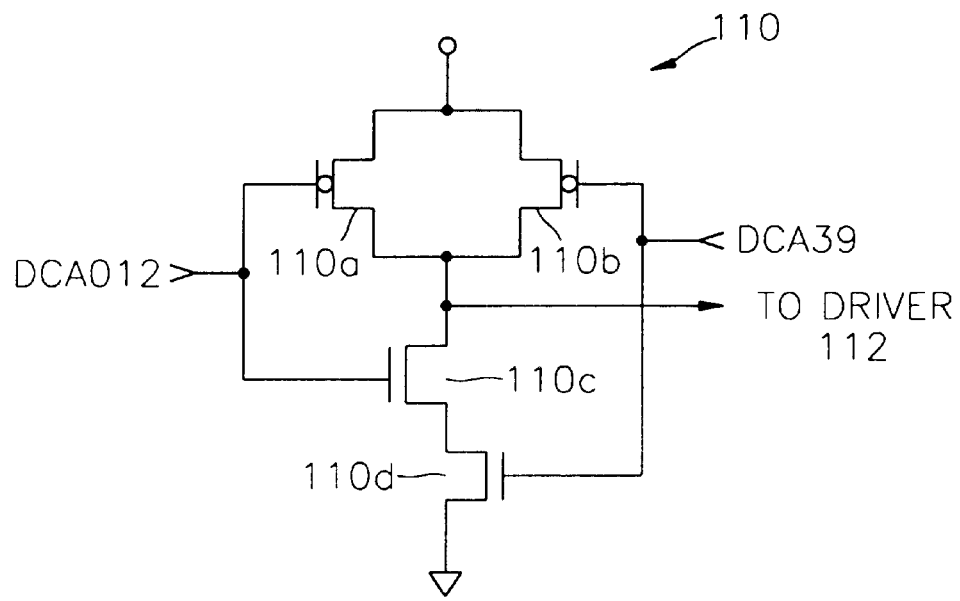
FIG. 12 is a logic diagram of a NAND gate of a column select line driver of FIG. 11.

First, the NAND gate 110 of the column select line driver 136 is smaller than the NOR gate 80 of the column select line driver 36. FIG. 12 is a logic diagram of the NAND gate 110 according to an embodiment of the present invention. Referring to FIG. 12, the NAND gate 110 includes two PMOS transistors 110a and 110b connected in parallel to each other and two NMOS transistors 110c and 110d serially connected to each other. The PMOS transistor 110a and the NMOS transistor 110c are driven by the signal DCA012, and the PMOS transistor 110b and the NMOS transistor 110d are driven by the signal DCA39. An output signal of the NAND gate 110 is forwarded from a node between the PMOS transistor 110b and the NMOS transistor 110c. In the generation of the output signal of the NAND gate 110, both PMOS transistors 110a and 110b contribute. Accordingly, each of the PMOS transistors 110a and 110b needs to have a half of the driving power required for generating the output signal, and thus the PMOS transistors 110a and 110b can be smaller than the PMOS transistors 80a and 80b of FIG. 9. In addition, as the sizes of the PMOS transistors 110a and 110b are reduced, the sizes of the NMOS transistors 110c and 110d are also reduced. Consequently, the size of the NAND gate 110 for driving the driver 112 can be reduced.

Second, the driver 112 of the column select line driver 136 is small. The size reduction of the NAND gate 110, which was described above, influences the size of the driver 112. In other words, since the driver 112 can drive the column select line CSL by turning on only PMOS transistor 112a, as shown in FIG. 11, the size of the driver 112 is reduced. Even though both of the NMOS transistors 112b and 112c operate when disabling the column select line CSL, the required size of each of the NMOS transistors 112b and 112c is half of the PMOS transistor 112a. Consequently, the size of the driver 112 is reduced.

Third, a buffer, such as the buffer 100 of FIGS. 3 and 10, is not necessary. Since the NAND gate 110 receives positive active signals, which are signals DCA012 and DCA39, the buffer 100 for inverting the signal DCA012 to DCA012B is not necessary, and the chip size can be reduced. The effect of the elimination of buffers increases as the number of memory cells increases.

Figure 13:
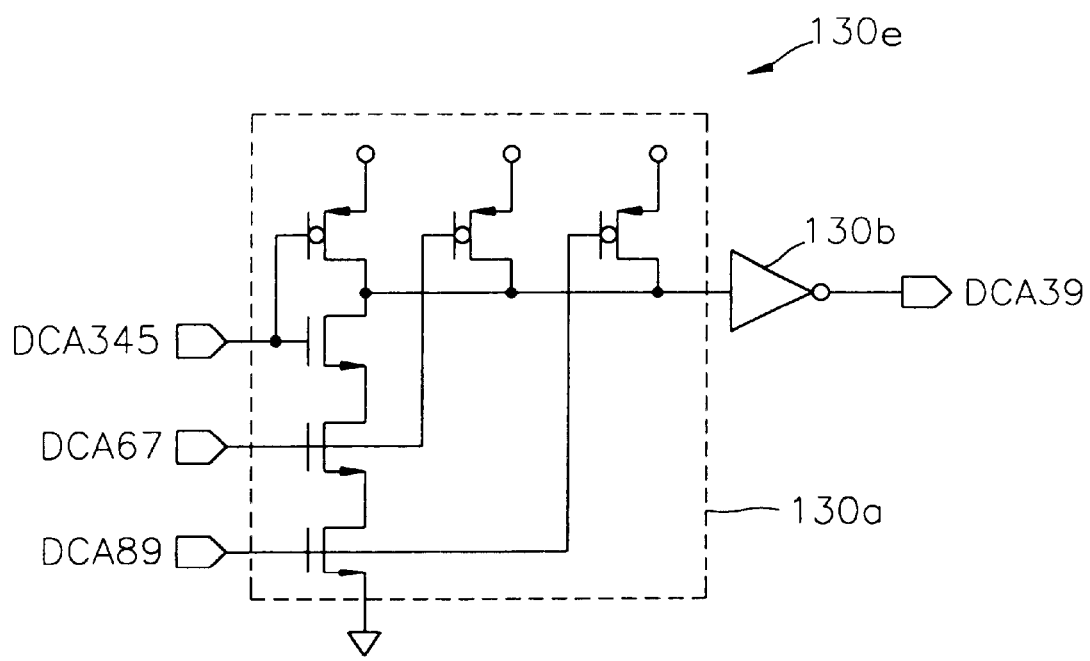
FIG. 13 is a logic diagram of a sub-predecoder suitable for the NAND gate of FIG. 11.

Fourth, a sub-predecoder 130e (FIG. 13) suitable for the column select line driver 136 requires a smaller driving power than the sub-predecoder 30e of FIG. 7. FIG. 13 is a logic diagram of the sub-predecoder 130e, which is equivalent to the sub-predecoder 30e, in accordance with an embodiment of the present invention. The sub-predecoder 130e includes an additional inverter 130b in addition to an AND gate 130a which is the same as the sub-predecoder 30e. The inverter 130b not only matches the logic level of the AND gate 130a with the logic level of the NAND gate 110 (FIGS. 11 and 12), but also contributes to the power of the sub-predecoder 130e required for driving the NAND gate 110. Accordingly, the size of the AND gate 130a, thus the size of the sub-predecoder 130e, can be reduced.

More specifically, it is generally known that the driving power of a preceding buffer needs to be one third of the driving power of a succeeding buffer. In driving the NAND gate 110 of FIG. 11, the AND gate 130a needs to have only one third of the driving power for the inverter 130b to drive the NAND gate 110. Consequently, the size of the sub-predecoder 130e can be reduced.

Fifth, regarding to FIG. 11, the inverter 116 may reduce the power of the NAND gate 110 and the driver 112 required for driving the column select line CSL. Since the inverter 116 contributes to the driving power for driving the column select line CSL as well as matches the logic level of the NAND gate to the logic level of the column select line CSL, thereby reducing the sizes of the NAND gate 110 and the driver 112. In other words, since the inverter 116 drives the column select line CSL, the driver 112 preceding the inverter 116 needs to have only one third of the driving power of the inverter 116. Accordingly, the driver 112 can be smaller than the driver 82 of FIG. 8. This effect is also applied to the NAND gate 110 preceding the driver 112.

Figure 14:
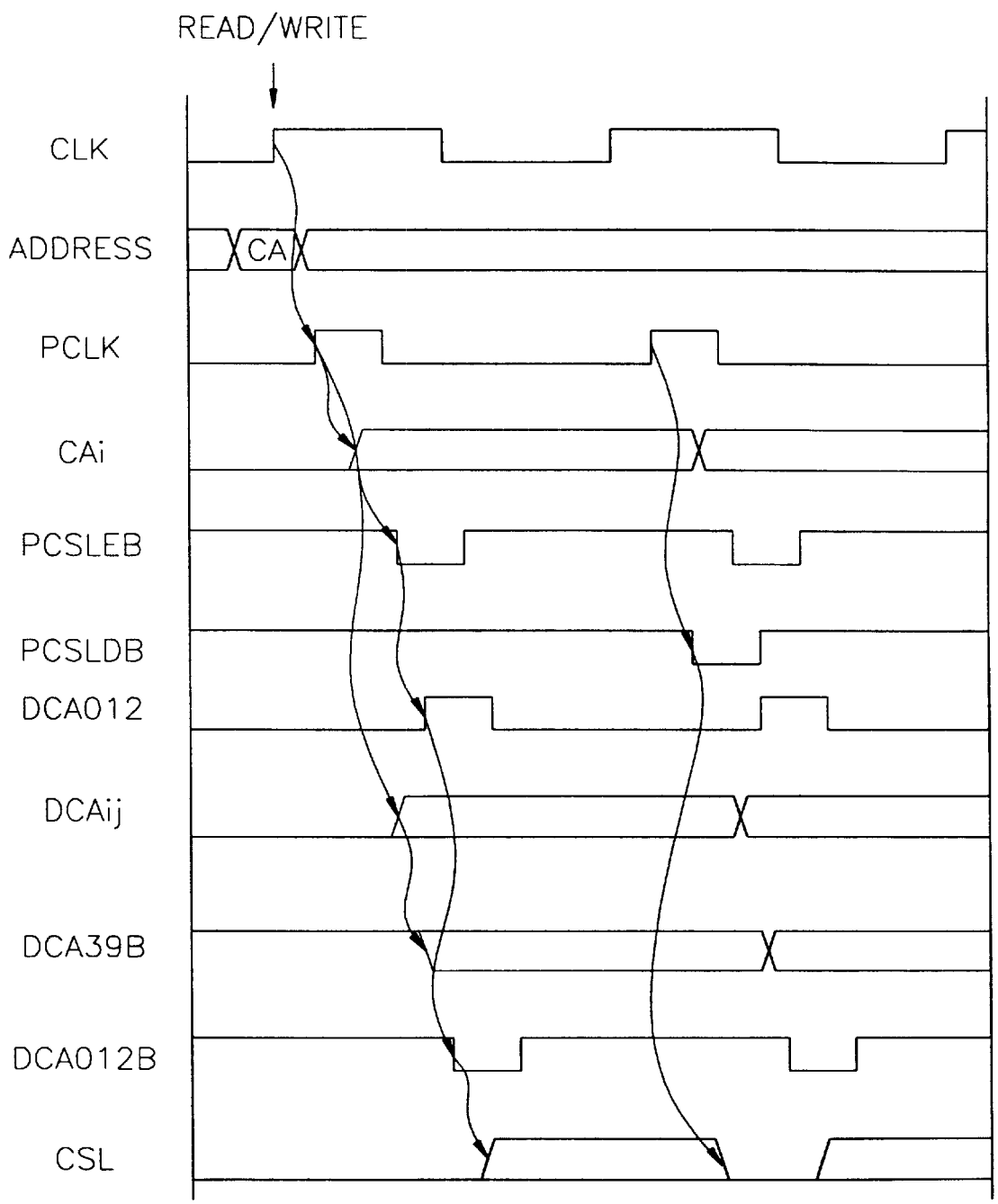
FIG. 14 is a timing diagram for showing an operation of the column decoder depicted with respect to FIGS. 3 to 10.

FIG. 14 is a timing diagram of an operation of the conventional column decoder depicted in FIGS. 3 to 10, and FIG. 15 is a timing diagram of an operation of the column decoder depicted in FIGS. 11 to 13 according to an embodiment of the present invention.

Referring to FIGS. 3 to 10 and 14, once a read or write command is applied, the column select line CSL is enabled in synchronization with the first rising edge of an external clock signal CLK and is disabled near the second rising edge of the external clock signal CLK. The external clock signal CLK is a clock signal applied from the outside of the column decoder, and the internal clock signal PCLK is generated in response to the external clock signal CLK. The internal clock signal PCLK is used in generating the column select line enable signal PCSLEB and the column select line disable signal PCSLDB.

The column select line enable signal PCSLEB is generated after the application of the column address signal CAi and in synchronization with the first falling edge of the internal clock signal PCLK. The column select line disable signal PCSLDB is generated in synchronization with the second falling edge of the internal clock signal PCLK. Being obtained by an AND operation on the three bits CA0, CA1, and CA2 of the column address signal CAi and the column select line enable signal PCSLEB, the signal DCA012 is generated a little delayed with respect to the column select line enable signal PCSLEB. The signals DCAij, which includes the signals DCA345, DCA67, and DCA89, and DCA39B are generated a little delayed with respect to the column address signal CAi. The signal DCA012B obtained by inverting the signal DCA012 is generated a little delayed with respect to the signal DCA012. The column select line CSL is enabled to a "high" level in synchronization with the signal DCA012B and is disabled to a "low" level in synchronization with the column select line disable signal PCSLDB.

Referring to FIGS. 11 to 13 and 15, since the signal DCA012 is obtained by performing an AND operation on the three bits CA0, CA1, and CA2 and the column select line enable signal PCSLEB, the signal DCA012 is generated a little delayed with respect to the column select line enable signal PCSLEB. The signals DCAij and DCA39 are generated a little delayed with respect to the column address signal CAi. The column select line CSL is enabled to a "high" level in synchronization with the signal DCA012 and is disabled to a "low" level in synchronization with the column select line disable signal PCSLDB.

Figure 15:
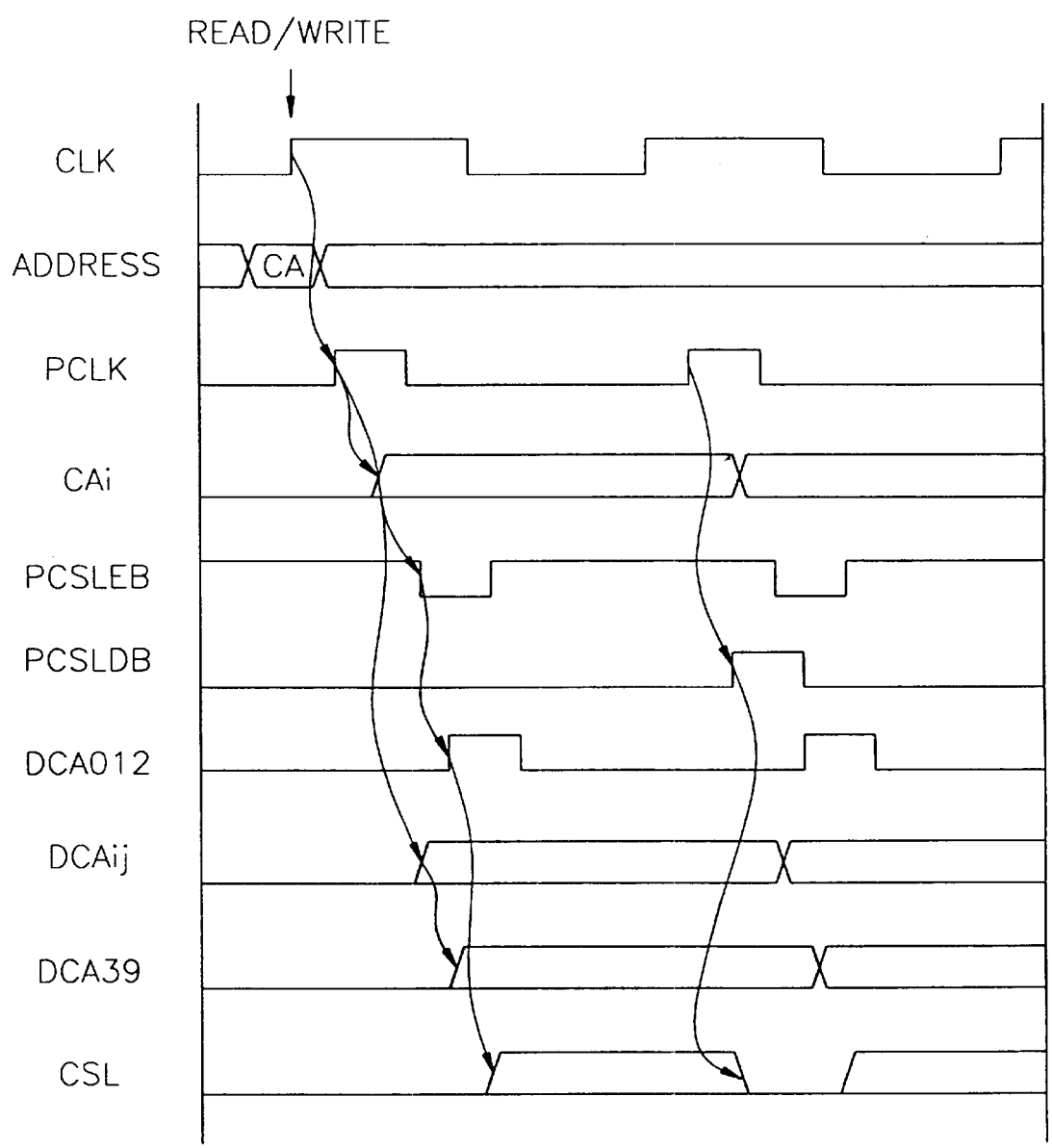
FIG. 15 is a timing diagram for showing an operation of the column decoder depicted with respect to FIGS. 11 to 13.

The timing of selecting a column select line CSL in FIG. 15 is similar to that in FIG. 14. Two buffers added to a sub-predecoder and a column select line driver according to the embodiment of the present invention did not result in a logic delay.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A column decoder circuit comprising:
    a decoder selecting a column select line in response to a column address signal; and
    a column select line driver that receives an output signal of the decoder, a signal including a column select line enable signal, and a column select line disable signal, and drives the column select line,
    the column select line driver further comprising:
        a NAND gate that performs a NAND operation on the output signal of the decoder and the signal including the column select line enable signal;
        a driver that is driven by the NAND gate;
        a latch that latches an output signal of the driver; and
        an inverter that inverts the latched signal and drives the column select line.

2. The column decoder of claim 1, wherein the driver comprises a first PMOS transistor and a first NMOS transistor which serially connect to each other, the gates of the first PMOS and the first NMOS transistors being coupled to the NAND gate, wherein an output signal from the driver is forwarded from a node between the first PMOS transistor and the first NMOS transistor.

3. The column decoder of claim 2, wherein the driver further comprises a second NMOS transistor which is between the node and the first NMOS transistor, the second NMOS transistor being driven by the column select line disable signal.

4. The column decoder of claim 1, further comprising:
    a first buffer that buffers the output signal of the decoder; and
    a second buffer that buffers the latched signal of the latch, wherein the first and the second buffers are inverters.

5. A column decoder comprising:
    a first pre-decoder that receives first column address signals and an enable signal, the first pre-decoder performing a NAND operation on the first column address signals and the enable signal to form a first output signal that includes the enable signal;
    a second pre-decoder that receives second column address signals and performs a NAND operation on the second column address signals to form a second output signal;
    a column select line driver that receives the first output signal with enable signal, the second output signal, and a column select line disable signal, the column select line driver driving a column select line;
    the column select line driver further comprising:
        a NAND gate that performs a NAND operation on the first output signal with enable signal and the second output signal;
        an internal driver that receives an output from the NAND gate and a column select line disable signal;
        a latch that receives and latches an output of the internal driver; and
        an inverter that receives an output of the latch and drives the column select line.

6. The column decoder of claim 5, wherein the column select line driver receives the first output signal of the first pre-decoder without the first output signal passing through a buffer to be inverted.

7. A column decoder circuit comprising:
- a decoder selecting a column select line in response to a column address signal; and
- a column select line driver that receives an output signal of the decoder, a signal including a column select line enable signal, and a column select line disable signal, and drives the column select line, the column select line driver including a NAND gate that performs a NAND operation on the output signal of the decoder and the signal including the column select line enable signal.

8. The column decoder circuit of claim 7, wherein the column select line driver receives the output signal without the output signal passing through a buffer to be inverted.

* * * * *